(12) United States Patent
Karthikeyan et al.

(10) Patent No.: US 7,856,332 B2
(45) Date of Patent: Dec. 21, 2010

(54) REAL TIME SYSTEM FOR MONITORING THE COMMONALITY, SENSITIVITY, AND REPEATABILITY OF TEST PROBES

(75) Inventors: Muthukumarasamy Karthikeyan, Fishkill, NY (US); Louis V. Medina, New Windsor, NY (US); Yunsheng Song, Poughkeepsie, NY (US); Tso-Hui Ting, Stormville, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 423 days.

(21) Appl. No.: 11/950,123

(22) Filed: Dec. 4, 2007

(65) Prior Publication Data

US 2009/0143999 A1  Jun. 4, 2009

(51) Int. Cl.
*G01R 31/02* (2006.01)
*G01R 31/00* (2006.01)
*G06F 19/00* (2006.01)
*G06F 17/40* (2006.01)

(52) U.S. Cl. .................. 702/85; 73/865.9; 324/537; 702/104; 702/182; 702/187; 702/189

(58) Field of Classification Search .................. 73/1.01, 73/1.88, 865.9, 866.5; 324/73.1, 500, 512, 324/522, 525, 537, 754; 702/1, 85, 86, 88, 702/90, 104, 107, 127, 182, 187, 189
See application file for complete search history.

(56) References Cited

U.S. PATENT DOCUMENTS

| | | | | |
|---|---|---|---|---|
| 3,082,374 A | * | 3/1963 | Buuck | 324/73.1 |
| 3,487,304 A | * | 12/1969 | Kennedy | 324/73.1 |
| 3,522,532 A | * | 8/1970 | McCoy | 324/73.1 |
| 7,612,573 B2 | * | 11/2009 | Kim et al. | 324/763 |
| 7,622,940 B2 | * | 11/2009 | Kim et al. | 324/763 |
| 2007/0090851 A1 | * | 4/2007 | Kim et al. | 324/763 |

* cited by examiner

*Primary Examiner*—Edward R Cosimano
(74) *Attorney, Agent, or Firm*—H. Daniel Schnurmann (57) ABSTRACT

A system and a method for effectively determining the measurement sensitivity, repeatability, and probe commonality to assist a test engineer determine if the tester meets the specified resolution at every test. A statistical measurement of inherent tester specifications are provided with the added accumulation of the probe contact resistance during the probing process. It further provides a feedback to the test probe card noise level while testing is in progress. Moreover, the system and the method determine the test probing integrity in-situ when testing integrated circuit chips or wafers, dynamically detecting probing errors, and modifying data associated with defective test probes.

22 Claims, 7 Drawing Sheets

REAL TIME SYSTEM FOR MONITORING THE COMMONALITY, SENSITIVITY, AND REPEATABILITY OF TEST PROBES

FIELD OF THE INVENTION

The present invention relates to the manufacture of semiconductor devices and packages, and more particularly, to a system and a method for monitoring the effectiveness of testing and probing wafers and IC chips.

BACKGROUND OF THE INVENTION

The fabrication process of VLSI components includes a large number of manufacturing steps wherein effects are created leading to circuit malfunction and low performance. By detecting manufacturing defects as well as characterizing the semiconductor devices performance, test equipment plays an important role that enables semiconductor manufacturers and designers to improve the manufacturing yield in addition to enhancing the quality and reliability of the end products.

Numerous electrical test methods have been put in place to monitor the quality and integrity of the IC fabrication process. Probing a wafer is typically the first time that chips are tested to determine if they function as they are designed to do. A tester probe card combination must provide a stable deterministic electrical behavior throughout the entire wafer testing process. Any variability of the test measurement tool, whether tester or probe card induced typically, reduces the repeatability and accuracy of the measurements being made.

The conventional approach to wafer test for ensuring test probing reliability includes:

a) A computer controlled tester performing a continuity test before bringing the probes on a wafer. The tester lands probing tips on a metal plate preferably made of cooper or tungsten, and a check is performed to determine whether every probe makes contact with the metal plate. Depending on the probing pressure setting and the landing topography difference from the metal plate to a macro in the chip limits the test to only a sanity check. A slight bending or soiled tip may be the cause of differences from other probes which may produce an impact on further device measurements that can no longer be detected from this test.

b) A test technician aligning the probing tips on the designated probing pads on wafer at a predetermined site. Then technician needs to check for any probe marks on the landing pads before setting the tester to run in an automatic mode. Depending on the training, experience and working attitude, generally this process does not ensure a reliable procedure to set up a test. For instance, a bent probe may barely land on the edge of a metal pad while others may 'drill' the center of the pads. Moreover, a bent probing tip may step away or even outside the landing pad of a second or subsequent wafers to be tested, even in the absence of a system warning.

c) Performing a continuity check prior to probing the wafer or chip. Before initiating a device measurement, the tester is set to run a continuity check when probing a macro at various sites on the wafer. A specification range is provided to evaluate the mean value of the measured current and deciding whether the probe makes contact with the test pads. At this stage, after the tester has been set to run automatically, it may continue collecting data while testing macros test in a lot, along with the probe continuity check. Then, a disposition form informs the technician when retesting the wafers is necessary after all the tests have been completed.

The above described methods fail to offer a reliable process that ensures the required high quality probing necessary for the next generation of testing wafers, and do not identify nor offer a finer resolution on the probe commonality. By way of example, a soiled probing tip typically introduces a higher contact resistance which impacts the device measurement results and which if ignored, mislead the test engineer into making a wrong decision.

Due to inherent tester specifications (including drift resolution, repeatability, linearity) with the added accumulation of probe contact resistance (Cres), it is not realistic to assume that the tester/probe card combination becomes deterministic over time.

Figure 1A:
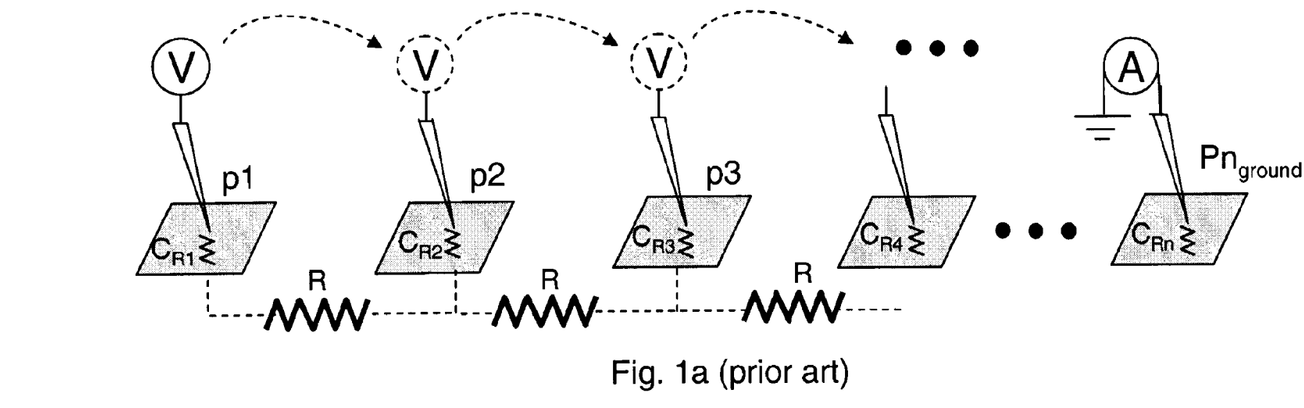
FIG. 1a is a schematic diagram showing a prior art test setup to perform a continuity test, the test setup consisting of a plurality of pads of a DUT, an array of probes contacting the pads, and a plurality of resistive connectors.

Referring to FIG. 1a, there is shown is a schematic diagram showing a prior art test setup to perform a continuity test, the test setup consisting of a plurality of pads of a DUT, an array of probes and a plurality of resistive connectors.

FIG. 1a shows an array of probing tips that is aligned to make contact to a plurality of probing pads. The probe continuity test is set up to take current measurements by applying a constant voltage to each probe, from $p_1$ to $p_{(n-1)}$ while grounding the end probe $P_{n\_ground}$. $P_{n\_ground}$ is intended to collect current sequentially for each probe to which the voltage is applied.

Figure 1B:
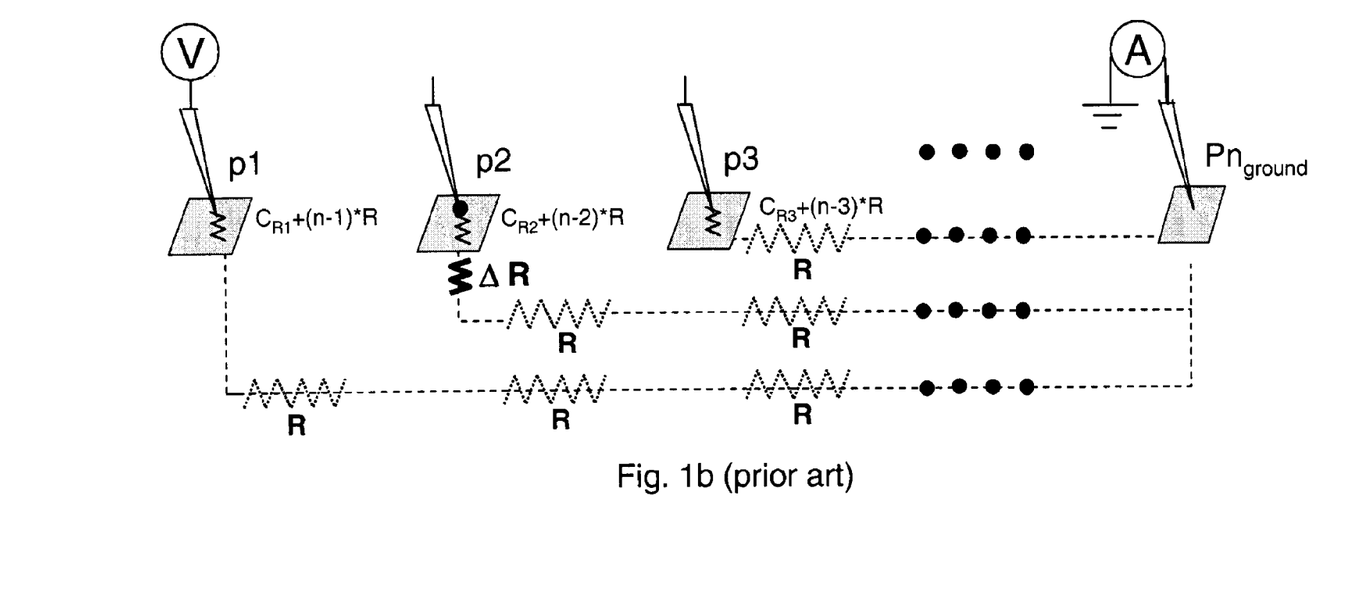

Referring to FIG. 1b, there is shown a schematic diagram of an alternate prior art test setup to perform the continuity test illustrated in FIG. 1a. Shown therein is a plurality of probing tips contacting landing pads. It is assumed that one probing tip, e.g., $p_2$ does not make good contact to its corresponding landing pad, perhaps because the landing contact is not as clean as it should be. The resistance of the path from the probe (p#) to which the voltage is applied to the probe $p_{n\_ground}$, where current is measured, is represented by $C_{R\#}+(n-\#)*R$, where $C_{R\#}$ represents the contact resistance of the probing tip and its landing pad; n, is the total number of probes in the probe card; #, is the probing tip number; and R, the resistance between each neighboring landing pad.

Illustrated in the FIG. 1b is a slight bent or soiled tip, $p_2$, making an imperfect contact with the probing pad. In this case, it does not cause an open contact or fail the continuity test. However, an additional contact resistance $\Delta R$ is introduced between probe $p_2$ and probe $P_{n\_ground}$.

Figure 1C:
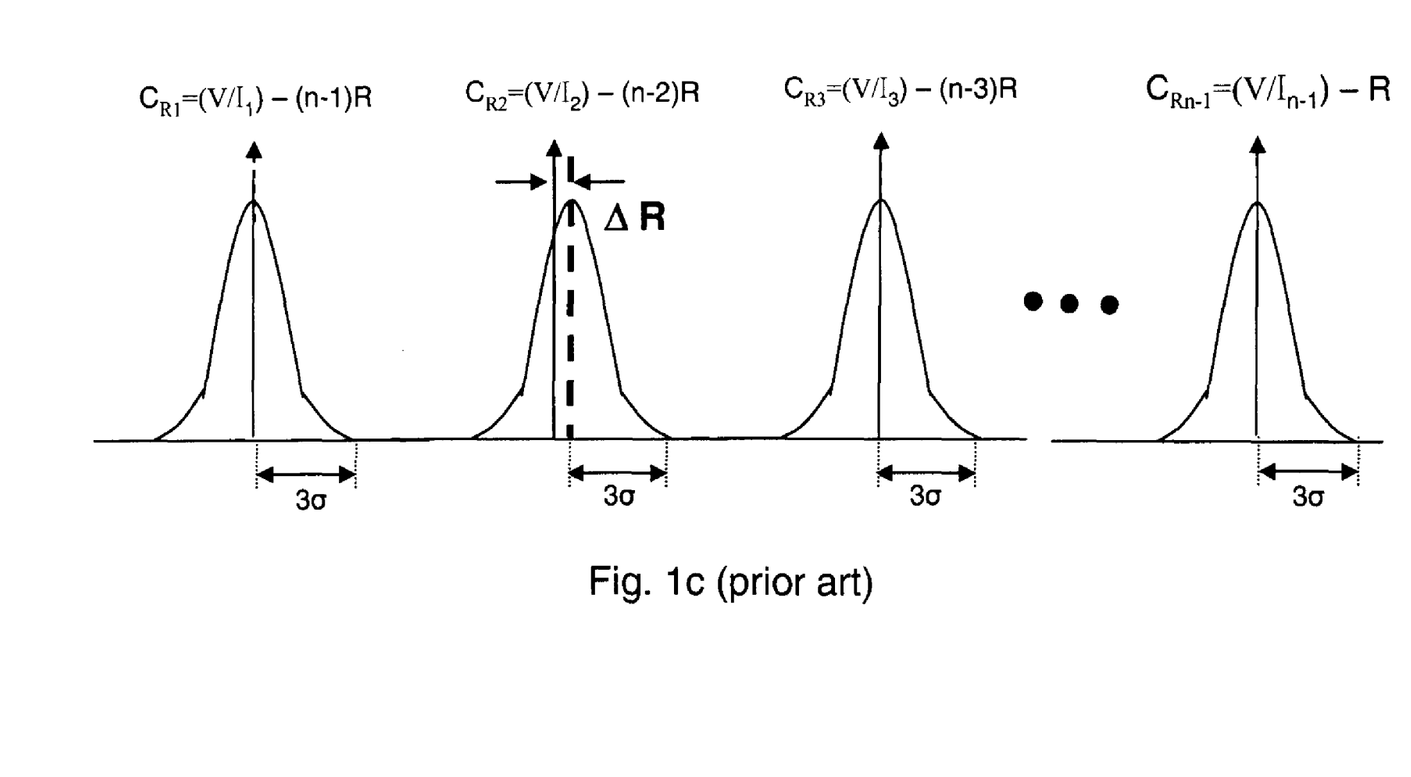
FIG. 1c illustrates the normalized measurement data distribution of each individual probe making contact with the pads.

FIG. 1c illustrates the normalized measurement data distribution of each individual probe making contact with the pads.

After taking multiple measurements, the distribution of continuity current data is generated. The collected current data can be converted and normalized to the corresponding contact resistance of the probing tip and landing pad, which can be presented by $C_{R\#}=(V/I\#)-(n-\#)R$, where # is the probing tip number; n, the total number of the probes in the probe card; R, the resistance between each neighboring landing pad; V, the applied voltage to the probe number #; and I, the measured current from the end probe $p_{n\_ground}$. It is assumed that the conducting wires between each neighboring pads has the same resistance as in an ideal condition.

The solid arrow represents the mean of the distribution. In an ideal case, the mean of each probe distribution should be the same. However, the distribution of the probe may shift $\Delta R$ due to a slight bending or soiled tip (illustrated by a dotted line). The shift of $\Delta R$ may not cause a continuity test fail; yet, it may cause a significant impact on the transistor's performance characterization.

In a conventional probe check, the setup described in FIG. 1a permits only the continuity current measurement to be taken between each probe and the end probe or between each pair of neighboring probes. A continuity current specification range or a contact resistance specification range is provided to decide if any probe has an open contact to the landing pad. Data may or may not be normalized in the conventional process. By way of example, still referring to FIGS. 1b and 1c, probe degradation, as illustrated by probe $p_2$, cannot be detected by conventional methods. The test generates unreliable device data that may have a significant impact on the engineering time spent for device characterization, and on the quality of the end product.

Therefore, there is a need to provide a system and a method for statistically measuring the tester probe cards' "noise floor" which is essential to understand the process variability for a given advanced semiconductor technology.

OBJECTS AND SUMMARY OF THE INVENTION

Accordingly, it is an object of the invention to provide a method for evaluating tester probe cards in real time based on inherent tester specifications.

It is another object to have a system capable of providing information on the probe commonality and probe contact quality at a finer resolution.

It is still another object to provide a method and a system for quantifying the drift of the resolution and repeatability induced from the tester or probe card over a period of time which can be monitored and characterized.

It is yet a further object to provide statistical models that can be processed in the test system while testing takes place, allowing an automatic warning that can be set and triggered by the process code.

It is still a further object to substantially augment the probing effectiveness by including measurement sensitivity as well as commonality and repeatability to determine whether the tester meets the specified resolution at every test.

It is still another object to characterize the components under test to determine if the measured data range remains within an acceptable noise level introduced by the measurement tool.

It is yet another object to achieve a thorough understanding on the variability and when a non-deterministic tester probe card behavior becomes critical, particularly when the electrical measurements during testing are taken down to the picosecond range.

These and other objects are achieved by a system and a method capable of effectively determining the measurements' sensitivity and repeatability, as well as the probe commonality, to assist a test engineer determine whether the tester meets the specified resolution at every test. The invention also provides a statistical measurement of inherent tester specifications with the added accumulation of the probe contact resistance during the probing process. It further provides a feedback to the test probe card noise level while testing is in progress.

In one aspect of the invention, statistical models, probe commonality, sensitivity, linearity, and repeatability are determined while testing is in progress, allowing necessary action to be taken while testing is in progress. The probe commonality test detects any significant differences between the probes' mean value from their normalized data distribution. The analysis that follows is preferably performed by applying Analysis of Variance (ANOVA) that enables all the probes to be compared with each other concurrently rather than individually.

The probe sensitivity described in another aspect of the present invention detects any significant differences between two current measurements distributions obtained by applying two voltages, Va and Vb, to a probe. A statistical method "t-test" is preferably applied for the analysis of each probe.

The probe linearity described in yet another aspect of the present invention recognizes the linear behavior between the measured current and the applied voltage from the probe, i.e., Ia/Ib=Va/Vb.

The probe repeatability described in the present invention determines for each probe the percentage of data outside the user defined range. This percentage is expressed as (1−(number of flyers of a single probe/number of measurements for a single probe))*100, and the data range that defines a flyer is calculated from the overall data population of all the probes.

In still another aspect, the invention provides a real time evaluation on inherent tester specifications including the added accumulation of probe contact resistance inexistent in current probing methodology. The effectiveness of probing to measurement sensitivity and repeatability, in addition to the probe commonality can be quickly examined, helping the test engineer determine whether the tester meets the specified resolution at every test. It further allows the engineer to determine if the measured data range remains within an acceptable noise level which may be introduced by the measurement tool.

The present invention has no significant impact on the test time and does not require any additional activity of landing probes contacting the pads over the conventional methodology. The same methodology can be applied to the tester's system prior to loading the actual hardware when performing a test. Data analysis algorithms are coded in the test system that enables the tester to evaluate the probe cards' commonality and sensitivity.

From a standard probe check point of view, after taking multiple measurements from chip-to-chip, wafer-to-wafer, and the like, each probe generates a set of normalized values which is the relative current at specified voltages. Vice versa, the same applies to the relative voltage with respect to specified currents. The probing pads are connected to a standard resistor, and the continuity test is performed between each pair of neighboring pads at a constant voltage. From a traditional probing procedure, a set of normalized values between each pair of neighboring pads is generated. Multiple readouts from two neighboring pads are taken, either from same chip site, different chips in a wafer, or selected wafers of a lot.

In a further aspect, the invention provides a method for determining test probing integrity when testing integrated circuit (IC) chips or wafers, dynamically detecting probing errors, and modifying data associated with defective test probes, the method including: i) applying a first and second voltage ($V_a$ and $V_b$) to each probe and measuring a current flowing through a path linking the probe to a landing pad contact of the IC chip or wafer; ii) normalizing the current measurements and characterizing said path linking the probe to the landing to pad contact; iii) generating statistical test data to flag defective probes; and iv) dynamically applying error modification to the test data corresponding to the flagged defective probes.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

FIG. 1b shows a schematic diagram of an alternate prior art test setup to perform the continuity test shown in FIG. 1a.

DETAILED DESCRIPTION

Figure 2:
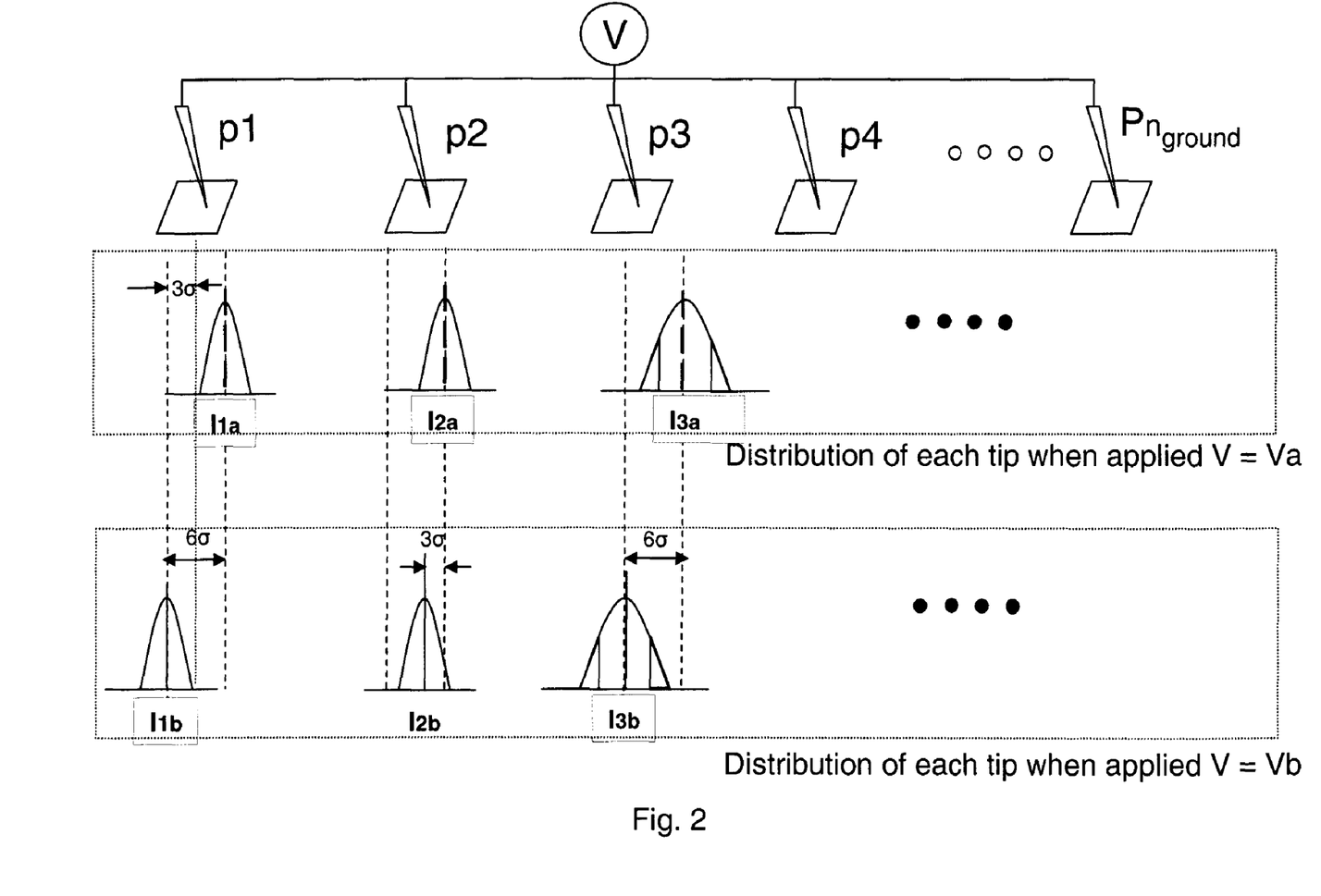
FIG. 2 is a schematic diagram for measuring the sensitivity and linearity of the test probes, wherein two sets of the current distribution for each probe are offset, resulting from applying two different applied voltages, in accordance with present invention.

Referring to FIG. 2, there is shown a schematic diagram of the present invention for measuring the sensitivity and linearity of the test probes, wherein two sets of the normalized current distribution for each probe are obtained from applying two sets of voltage, Va and Vb, to each probe. The shifts of two populations of each probe resulting from the second applied voltage can be categorized in three categories, according to the present invention.

The first case shows probing pin, displaying a "low variability" and significant difference between two current populations, $I_{1a}$ and $I_{1b}$, obtained by applying voltages Va and Vb, respectively. In addition, the linear behavior of Ohm's Law (V=I*R) applies to the shift of the mean of the two populations, i.e., mean_$I_{1a}$/mean_$I_{1b}$=Va/Vb.

The second case shows probing $pin_2$ that indicates a "low variability" but an insignificant difference between the two populations, $I_{2a}$ and $I_{2b}$, due to the delta of the mean value which is insufficiently separated, as expected. Furthermore, a non-linear behavior of probing $pin_2$ is determined by the mean_$I_{2a}$/mean_$I_{2b}$≠Va/Vb.

The third case shows probing $pin_3$ that indicates a "median variability" or "high variability" of current distributions $I_{3a}$ and $I_{3b}$ obtained from applying voltages Va and Vb, respectively. Due to the wider distribution expressed by a larger σ, a non-significant difference between $I_{3a}$ and $I_{3b}$ can be determined, though the shifting of mean_$I_{3a}$ and mean_$I_{3b}$ behaves linearly, according to the shift generated by applying voltages Va to Vb.

Other cases can be considered but are not illustrated in FIG. 2, e.g., a significant difference between two populations but the non-linear behavior of shifting mean_Ia to mean_Ib, which can also be determined by the method described in the present invention.

Figure 3:
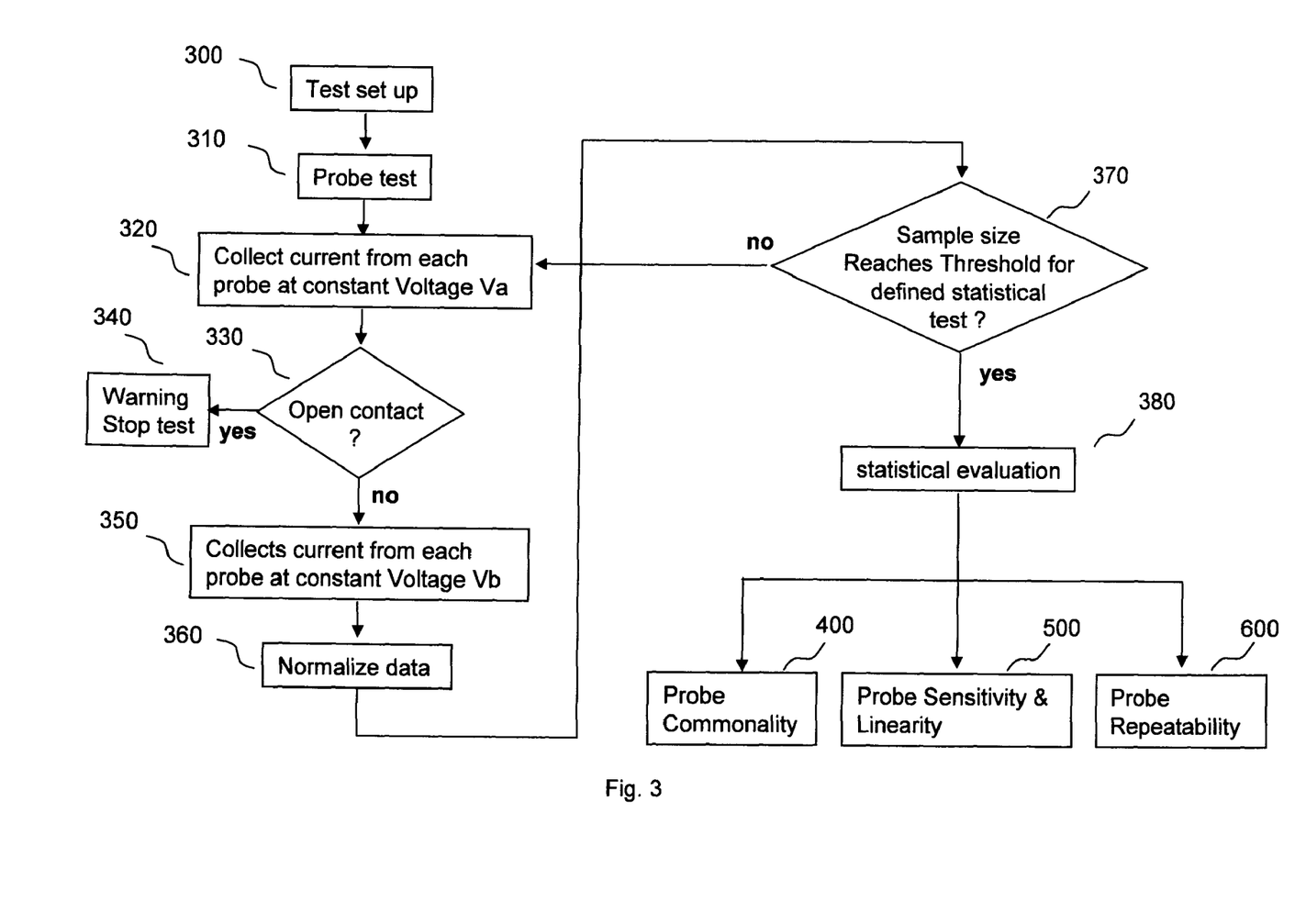
FIG. 3 is a flow chart according to the present invention, showing steps necessary to achieve probe commonality, probe sensitivity/linearity and probe repeatability, according to the present invention.

Referring now to FIG. 3, there is shown a flow chart according to the invention, illustrating steps necessary to achieve probe commonality, probe sensitivity/linearity and probe repeatability.

In step 300, the process is initiated by performing a wafer electrical test. The test setup includes the following steps: loading a wafer carrier to the tester, loading the wafer on the chuck for probing, the tester performing a probe continuity test on a metal plate, and aligning the probes to the landing pads at some chip site of the wafer. More particularly, the users have the option of selecting which analysis is preferable throughout the wafer test. Depending on different test purposes and conditions, the user can elect either one, multiple, or all the options to determine the probe commonality, probe sensitivity/linearity, and probe repeatability. In addition, the user needs to define a lesser number than necessary for the statistical analysis to be elected, such as the minimum sample size to initiate the statistical analysis, the probability level for determining significant difference for an ANOVA test in the probe commonality analysis, the α (alpha) level for the t-test for the probe commonality and probe sensitivity analysis, the constant value defining the flyer range in the probe repeatability analysis. Moreover, the threshold for accepting the probe repeatability and the defective probe ratio are necessary for determining whether the test can continue with the probe repeatability analysis, all of which being decided in step 300.

Following step 300, step 310 shows probing tips aligned and landing on the probing (or landing) pads and making contact between the probing tips and the landing pads. The probe continuity test on wafer is now ready to begin.

At step 320, the probe continuity test is initiated. Referring back to FIG. 1a, a measurement is taken by applying a constant voltage Va to each probe, from $p_1$ to $p_{n-1}$, keeping the end probe $P_{n\ ground}$ grounded. The probe $p_{n\ ground}$ is set to collect current measurements sequentially for each probe to which the voltage is applied. Upon completing the continuity measurement for all the probes by way of applying voltage Va, the process branches to step 330 to examine the measured data of each probe at a predefined specified range of continuity current or contact resistance. If any probe fails the continuity test, indicative of a poor alignment or bent probes, an automatic feedback system is preferably set to give a warning or to stop, as shown in step 340. If each probe passes the continuity test, then at step 350, the second voltage, i.e., Vb, is applied using the same approach detailed in step 320. Now, there are two data sets for each probe obtained from applying voltage Va and Vb. In order to perform further statistical analyses, in step 360, the measurement data is preferably normalized to eliminate other resistive factors in the path, while still focusing on each individual probe/pad contact. Referring back to FIG. 1c, and assuming that the conducting wires between each neighboring pads have the same value R (in an ideal condition), the contact resistance of each probe can be converted to $C_{R\#}$=(V/I#)−(n−#)*R, where # is the probing tip number; n, the total number of probes in a probe card; R, the resistance between each neighboring landing pad; voltage V, the applied voltage to the probe number #; and I, the measured current from the end probe $p_{n\_ground}$.

The process then branches to step 370 after completing each set of measurements as shown with reference to steps 320 to 360. In order to perform a meaningful statistical analysis, the system preferably checks whether the number of test sample from a test site is sufficient to provide a good sample size to perform a statistical analysis. The user defines the threshold of the sample size, e.g., greater than 8, to start the statistical analysis, according to an embodiment of the present invention. If the sample size is less than the predefined threshold, then no statistical analysis should be performed. The process then proceeds by branching back to step 320, allowing but more data needs to be collected. When the sample size reaches the predefined threshold, the process flow continues with the statistical analysis, and proceeds to step 380.

In the present invention, three categories of statistical analyses are described, and are listed in step 400 for the probe commonality; in step 500, for the probe sensitivity and linearity; and in step 600, for the probe repeatability.

Before performing a defined statistical test, at step 380, the system checks on the user's choice, and depending on the test requirements, either one or all the analysis is performed. Further down the process flow, the probe commonality determines whether there are significant differences between the probing tips, as described in step 400. Details of the probe sensitivity and linearity, which determine the probes' data resolution and linear behavior, are described in step 500, while details of the probe repeatability that determine the noise or the percentage of data from each probe outside a predefined range, are described in step 600.

Figure 4:
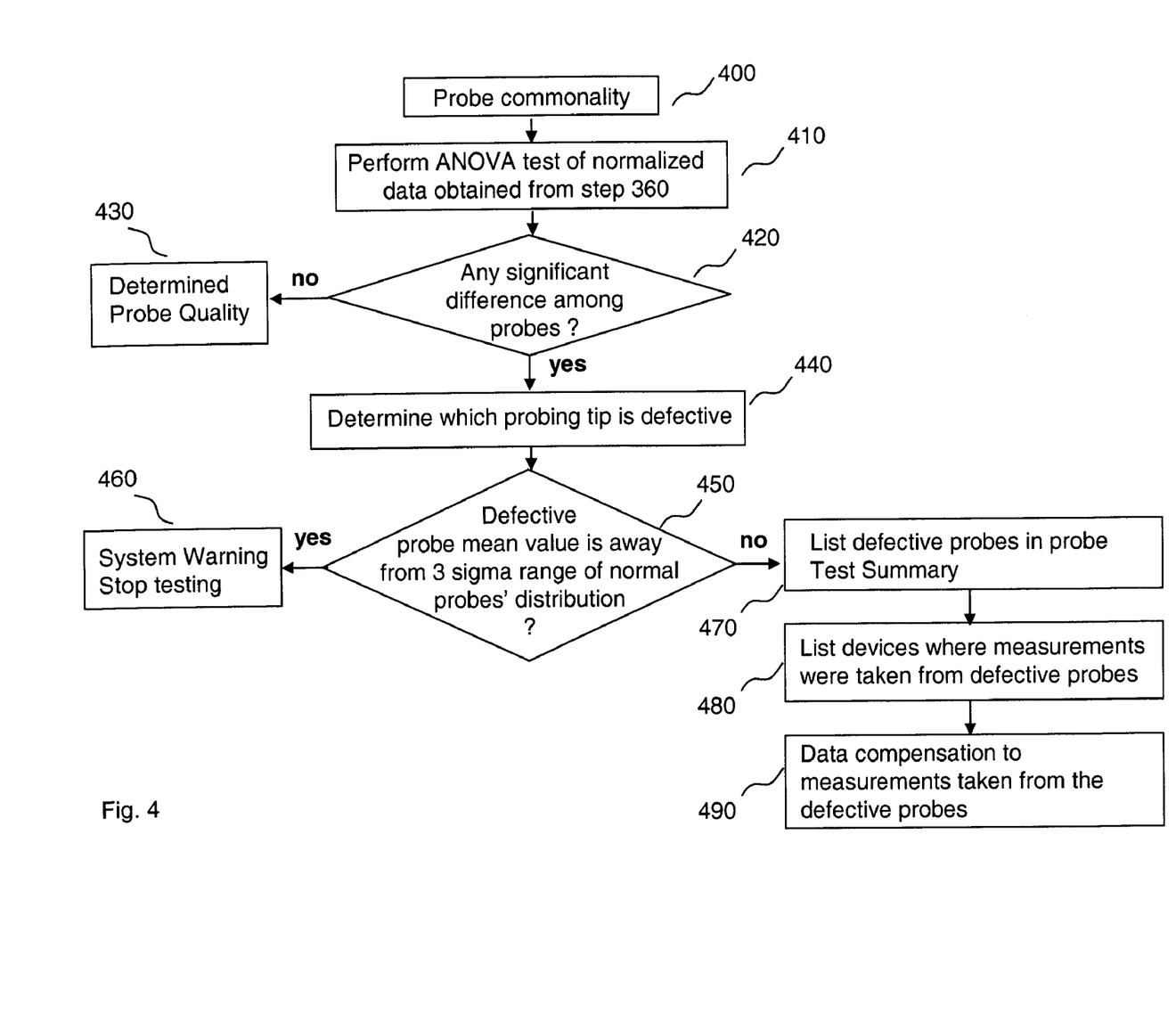
FIG. 4 is a flow chart illustrating steps necessary to achieve probe commonality, according to the present invention.

Referring now to FIG. 4, there is shown a flow chart according to an embodiment of the invention, illustrating steps necessary to achieve the determination of probe commonality, after selecting step 400 (FIG. 3). Preferably, the raw data and normalized data are advantageously stored in a database. In step 410, a statistical method, e.g., the analysis of variance (ANOVA), is preferably used for determining if any probe shows a significant difference of the contact characteristics differentiated from the others. A one-way ANOVA, also referenced as single-factor ANOVA, is preferably adopted for determining the probe commonality. Here, the normalized measurement becomes the response variable, and the probe number is used as the independent variable.

In step 420, the system determines whether any statistical significant differences across the range of the set of probes based on a predefined p-value exist, as shown in step 300 (FIG. 3). By convention, levels of 0.05 and 0.01 are preferably to be used. In the method described, the preferred value p-value is 0.01. In step 420, if no significant difference is found from the ANOVA test, it is indicative that all the probes are of the same quality without offset.

The process then branches to step 430, where no action needs to be taken, allowing the next statistical analysis to follow. A typical device test is now ready to be performed. In case where significant differences across the probes are determined by ANOVA, in step 420, the system proceeds to step 440 where the system calculates the mean from the overall data point, referenced to as $Ia\_{mean}$, and taking it as the control group. The statistical analysis t-test is performed against each probe to examine which probe is different. The alpha ($\alpha$) level for the t-test was previously selected in step 300, i.e., in the test setup. Thereafter, the probe showing a significant difference is identified. Next, in step 450, the system examines if the defective probe has its mean value, $Ia_{\#\_mean}$, having a $3a$ shift away from the normal probes mean value, $Ia_{normal\_mean}$, where a applies to the normal probes' data population. If it is true, even though the probe passes the continuity test, in step 330, the system determines whether to terminate the test and/or emit a warning signal (step 460).

In step 450, if the system determines that the shift of the mean from the problematic probe remains within an acceptable noise range, the system proceeds by processing the test data and branches to step 470. In the present invention, 3σ of the normal probes distribution remains within the acceptable noise range. The user has the option to set a different noise level for the test setup, as shown in step 300.

In step 470, the system preferably summarizes the probe commonality results, listing the pin number of the problematic probe(s) and the percentage of the mean shift from the overall mean. In step 480, the system scans through the test files which are set for the wafer test, and lists all the devices corresponding to those having a current measurement of problematic probe(s). In step 490, the system generates a second set of data with a compensated value for those devices wherein measurements were taken from the defective probes. Assuming an Ohm's linear behavior, all the probes to landing pads, including those attributed to defective probes, the compensated value is generated by $$I\_comp = I\_real(1-((Ia_{\#\_mean}-Ia_{norm\_mean})/Ia_{norm\_mean})\%).$$

Though, the compensated value does not provide perfect compensation to match exactly the value to be taken, it is deemed to be an adequate approximation for the user to characterize the test data.

Figure 5:
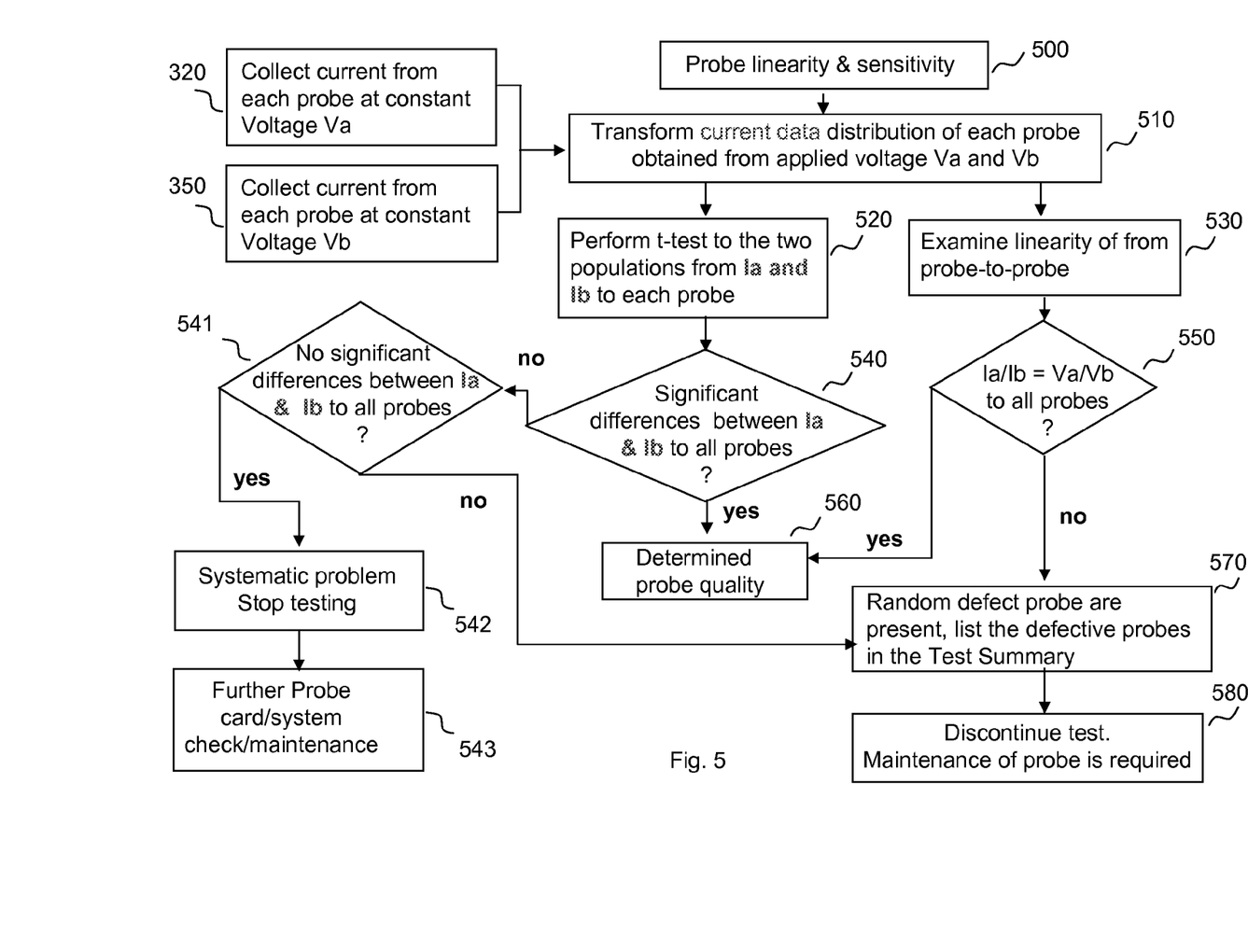
FIG. 5 is a flow chart illustrating steps necessary to achieve probe sensitivity and linearity, in accordance with the present invention.

The probe linearity will now be examined starting at step 500. If the probe linearity fails, then the test stops, and all the data is discarded.

Referring now to FIG. 5, there is shown a flow chart illustrating preferred steps to determine the probe sensitivity and linearity, following step 500 (FIG. 3). The probe sensitivity is also referred to as probe resolution, and is determined by a statistical analysis from two sets of normalized data for each probe obtained by applying voltage Va, step 320, and Vb, step 350. After the two sets of normalized data for each probe have been transformed (steps 320 and 350), by branching to step 510, the system proceeds with a t-test analysis (step 520) for each probe. The t-test assesses whether the means of two groups of data of each probe obtained from Va and Vb, are statistically different from each other. The two groups of data populations from one probe are illustrated in FIG. 2. The alpha ($\alpha$) level was initially set by the user (in the test setup, step 300). Alpha ($\alpha$) levels of 0.01 and 0.05 are selected in most cases. After completing the t-test for each probe, in step 540, the system examines the t-test result of each probe and determines if any probe shows a significant difference between data populations $I_{\#a}$ and $I_{\#b}$. In case where every probe shows a significant difference, in step 560, the system assumes that each probe has good resolution, as determined from the test specifications. In case where any single, multiple or all the probes do not show a significant difference, a further examination proceeds with step 541. While the tester proceeds with further device testing, the system can preferably perform the next statistical analysis as required by the user when the test was set up (in step 300).

In step 540, the system determines whether certain probes show a significant difference from the data populations $I_{\#a}$ and $I_{\#b}$. Then, the system examines in step 541, if each probe shows a non-significant difference between its data groups $I_{\#a}$ and $I_{\#b}$. If it holds true, and no probe displays a significant difference (step 542), then the system establishes whether it was due to a systematic problem, in which case the process is terminated. The test results may indicate poor quality of the probes or probe cards, or a poor performing test system, or perhaps that the second voltage Vb, applied in step 350, was inadequate. Proceeding with step 543, further action of examining and maintenance is advisable. Back to step 541, if not every probe shows a non-significant difference between data groups of $I_{\#a}$ and $I_{\#b}$, i.e., some probes show a significant difference between data groups of $I_{\#a}$ and $I_{\#b}$ and some probes do not, it is indicative of randomly distributed defective probes in the probe card since some probes have good resolution but some probes do not.

The system now branches to step 570, and preferably lists and summarizes the problematic probes. In the present invention, it is suggested that the test be discontinued, as in step 580, and the defective probes need to be physically examined and repaired. Of course, users can set up another decision tree at this point. The user has the option of setting a threshold of percentage of defective probes to decide whether to continue the test or stop. In case where there is only one probe showing poor resolution, the user may decide to continue the test, and elect to have further data compensation, or ignore the data of those devices which had been measured from the defective probe.

In step 530, proceeding from step 510, the system shows having two groups of data, $I_{\#a}$ and $I_{\#b}$ from each probe, and the linear behavior of each probe is examined. Ohm's Law is applied in step 530 to examine if $I_{\#a}/I_{\#b}=V_{\#a}/V_{\#b}$ holds true. It may suggest some connectivity issues in the probe card when the probe does not show a linear Ohm's Law behavior. An unpredicted measurement result will come out from the probe.

In step 550, the system checks if every probe shows a linear behavior. If it is true, the process branches to step 560. A good quality probe card is determined by examining the probe linearity. Otherwise, the system proceeds to step 570 to list the problematic probes. In the present invention, it is advisable that the test be discontinued (step 580), and the defective probes and the probe card be examined and repaired.

Figure 6:
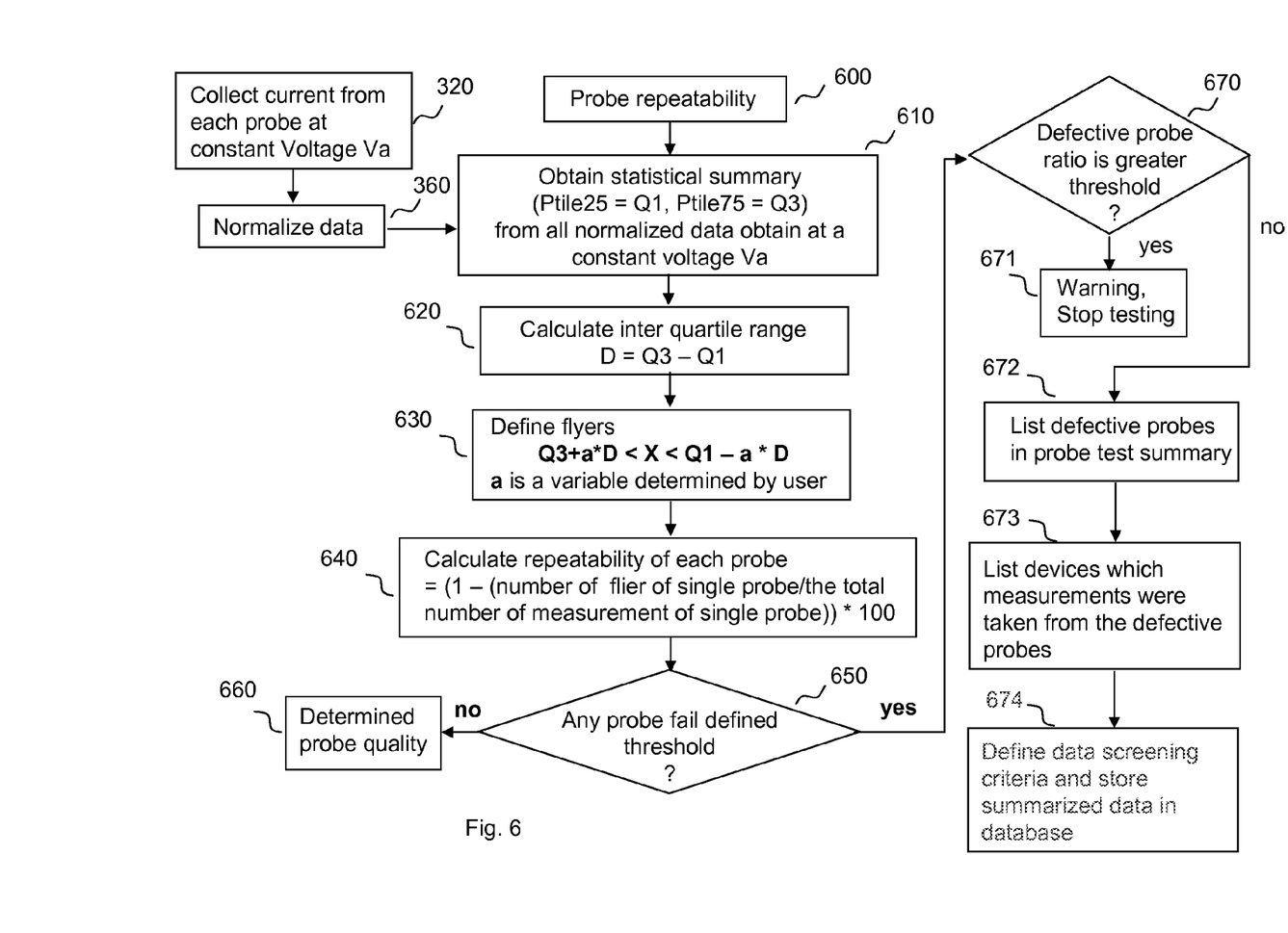
FIG. 6 is a flow chart illustrating steps necessary to achieve probe repeatability, in accordance with the present invention.

Referring now to FIG. 6, there is shown a flow chart illustrating preferable steps to determine the probe repeatability, a continuation from step 600 (FIG. 3). In step 610, normalized data from all the probes is collected from step 360, originating from step 320 when voltage Va was applied. Then, the statistically processed percentiles 'Ptile 25' (referenced to as Q1) and 'Ptile 75' (referenced to as Q3) are determined.

In step 620, the 'Inter-Quartile Range' is calculated from the overall data population, defined as D=Q3−Q1. Based on the 'Inter-Quartile Range', in step 630, the data range defines a flyer, determined by the following inequalities:

$$X>Q3+a*D \text{ or } X<Q1-a*D$$

where 'a' is a variable determined by the user to adjust the range of defining flyers.

The value 'a' is inputted from step 300, i.e., test set up. Otherwise, a default value 3 is preferably assigned. In step 640, having defined the flyer's range, the number of flyers is determined for each probe, and the probe repeatability is calculated. The formula defining the percentage is obtained from:

(1−(number of flyer of single probe/the total number of measurement of single probe))*100

In step 650, the system examines each probe to determine if the probe repeatability is greater than the predefined threshold, as defined in step 300. A threshold of 99% is preferably selected. The system then checks if any probe fails the repeatability analysis. If it does not, all the probes are deemed to meet the repeatability criteria, and the process branches to step 660. The system determines if probing is in good condition and no further action is required. If this holds true, and any probe is found failing repeatedly, the system branches to step 670 and calculates the percentage of defective probes in the probe card. It also decides if the test can continue based on the predefined threshold defined in step 300. By way of example, if there are 50 probing tips in the probe card, and the user permits only one probe to have more flyers than expected, the defective ratio to be defined in step 300 is equal or less than 2%. If the system finds out that the ratio exceeds the predefined threshold, e.g., 2%, then the system determines in step 671 whether to stop testing and/or set off a warning. If the ratio remains within the acceptable range as defined in step 300, the system opts to continue with the wafer testing. In step 672, the system generates a summary of defective probes from the repeatability analysis. The summary table can also be formatted to include the overall probing test summary previously described with reference to steps 470 and 570. Furthermore, in step 673, the summary should preferably include a list of the devices whereat measurements were taken from defective probes. After the wafer test is completed, in step 674, the user can decide to exclude those devices from subsequent characterization work. Moreover, the user has the opportunity to review the test results and decide whether the test is conducted with appropriate probe contact. In such instance, the user can decide either to exclude data of those devices collected from defective probes, or to continue with the characterization work. Summary data, including raw measurement data, probe defect flag, probe quality statistical data and final summary data, is advantageously stored in a database at the end of the test process.

The present invention can be realized in hardware, software, or a combination of hardware and software. The present invention can be realized in a centralized fashion in one computer system, or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

It is noted that the foregoing has outlined some of the more pertinent objects and embodiments of the present invention. The present invention may be used for many applications. Thus, although the description is made for particular arrangements and methods, the intent and concept of the invention is suitable and applicable to other arrangements and applications. It will be evident to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

While the present invention has been particularly described in conjunction with a specification and preferred embodiments, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method of determining test probing integrity when testing integrated circuit (IC) chips or wafers, dynamically detecting probing errors, and modifying data associated with defective test probes, the method comprising:
 a. using a computer, applying a first and second voltage (Va and Vb) to each probe and measuring a current flowing through a path linking the probe to a landing pad contact of the IC chip or wafer;
 b. normalizing the current measurements and characterizing said path linking the probe to the landing to pad contact;
 c. generating statistical test data to flag defective probes; and
 d. dynamically applying error modification to the test data corresponding to the flagged defective probes.

2. The method as recited in claim 1, wherein said characterization is achieved by applying a statistical analysis to each individual path linking the probe to the landing pad contact.

3. The method as recited in claim 1, wherein a warning is emitted when the probes fail to display a predetermined commonality, sensitivity, linearity, or repeatability.

4. The method as recited in claim 1, further comprising determining whether the measured data range remains within a predetermined noise level generated by a measurement tool.

5. The method as recited in claim 1, further comprises taking measurements extending from chip-to-chip and wafer-to-wafer, each probe generating a set of normalized values based on the respective measured currents resulting from applying predetermined voltages.

6. The method as recited in claim 1, wherein said probing is executed by discrete probes or probe cards.

7. The method as recited in claim 1, wherein a plurality of current measurements from each probe and a plurality of measurements collections are provided from one kerf site or from different sites of said wafer or plural wafers.

8. The method as recited in claim 1, wherein sets of normalized measurement are generated between pairs of neighboring contact pads.

9. The method as recited in claim 8, wherein each probe generates its set of normalized measurements based on the applied voltages and respective currents.

10. The method as recited in claim 1, further comprising performing an analysis of probe commonality, probe sensitivity and linearity, and probe repeatability, said analysis being performed in-situ.

11. The method as recited in claim 10, wherein the probe linearity comprises detecting a shift between two sets of measurements obtained when comparing the measured currents from applying the voltages Va and Vb against an expected linear behavior.

12. The method as recited in claim 10, wherein said probe sensitivity further comprises:
 a. using a computer, applying first and second voltages (Va and Vb) to each probe contacting a landing pad of said wafer or integrated chip and taking corresponding current measurements thereof;
 b. normalizing said current measurements to characterize each probe contacting the landing pad corresponding to said first and second voltages;
 c. determining a good probe sensitivity by applying a t-test analysis to each probe to determining for each probe a measurable difference between the current obtained from applying the voltages Va and Vb; and
 d. comparing said measured current to corresponding current values as they apply to the remaining probes.

13. The method as recited in claim 12, further comprising:
 a. flagging abnormal probes with poor sensitivity which do not give significant differences between the current measurements; and
 b. flagging an abnormal test system resolution if all the probes showing an insignificant difference between the measured currents obtained from applying the voltages Va and Vb.

14. The method as recited in claim 10, wherein said probe commonality comprises:
 a. applying a voltage to each probe contacting the landing pad of said wafer or integrated chip and taking corresponding current measurements thereof,
 b. normalizing said current measurements to characterize each probe contacting the landing pad corresponding to said applied voltage;
 c. flagging the probes having normalized current measurements that differ from the normalized current measurements that apply to the entire probe population; and
 d. determining defective probes by applying thereto an analysis of variance (ANOVA).

15. The method as recited in claim 14, wherein said ANOVA is a one-way analysis of variance of which said normalized current measurement become a response variable, and the probe number is an independent variable.

16. The method as recited in claim 15, wherein said ANOVA further comprises:
 a. determining if there are in said probe population, statistical significant differences in said normalized current measurements;
 b. dynamically applying error modification to said test data corresponding to said flagged defective probes of which the mean value is within $3\sigma$ of the entire probe population; and
 c. terminating said test if the defective probes have their respective mean value outside of said $3\sigma$ range.

17. The method as recited in claim 10, wherein determining the probe repeatability comprises:
 a. performing a statistical analysis on a number of flyers of a probe compared to the number of measurements made on predetermined probe;
 b. using the entire data population from all the probes to determine an Inter Quartile Range; and
 c. determining a percentile 25 (Q1) and percentile 75 (Q3) of the entire data population from all the probes.

18. The method as recited in claim 17, wherein the interquartile range D is determined by D=(Q3−Q1).

19. The method as recited in claim 17, wherein said probe repeatability is calculated from equation:

1−(number of flyers of a probe/the total number of measurement of one probe)*100.

20. The method as recited in claim 19, wherein the flyers are determined by inequalities:

$X > Q3 + a*D$ or $X < Q1 - a*D$, wherein 'a' is a variable determined by a user and is dependent on test conditions.

21. A system of dynamically detecting probing errors and compensating for defective test probes when testing a wafer or integrated chip, the method comprising:
 a. using a computer, applying first and second voltages to each probe and taking respective current measurements of said wafer or integrated chip probe contacting said landing pad;

b. normalizing said current measurements and applying an analysis of variance on said normalized current measurements to characterize each individual probe contacting said landing pad;
c. determining a probe sensitivity by applying a t-test analysis to each probe and determining for each probe a measurable difference between the current obtained from applying said first and second voltages;
d. generating test data based on said characterization to flag defective probes; and
e. dynamically applying error compensation to the test data corresponding to the flagged defective probe.

22. The system as recited in claim 21, further comprising: determining a probe linearity determined by detecting a shift between two sets of measurements obtained by comparing the currents from applying the voltages Va and Vb against an expected linear behavior.

* * * * *